United States Patent [19]
Van Autryve et al.

[11] Patent Number: 6,014,979
[45] Date of Patent: Jan. 18, 2000

[54] LOCALIZING CLEANING PLASMA FOR SEMICONDUCTOR PROCESSING

[75] Inventors: Luc Van Autryve, Voinsles, France; Stefan Oswald Lang, Holzgerlingen, Germany

[73] Assignee: Applied Materials, Inc., Santa Clara, Calif.

[21] Appl. No.: 09/102,964

[22] Filed: Jun. 22, 1998

[51] Int. Cl.[7] .............................. B08B 7/00; H05H 1/02
[52] U.S. Cl. ..................... 134/1.1; 134/1.2; 216/67; 216/71; 438/905
[58] Field of Search .................. 134/1.1, 1.2; 216/67, 216/71; 438/905

[56] References Cited

U.S. PATENT DOCUMENTS

| | | | |
|---|---|---|---|
| 4,960,488 | 10/1990 | Law et al. | 156/643 |
| 5,158,644 | 10/1992 | Cheung et al. | 156/643 |
| 5,676,759 | 10/1997 | Ye et al. | 134/1.2 |

*Primary Examiner*—Randy Gulakowski
*Assistant Examiner*—Saeed Chaudhry
*Attorney, Agent, or Firm*—Ashok Janah

[57] ABSTRACT

A process for etching a substrate 20 in a process chamber 25 having sidewalls 30 and a sacrificial collar 100, and for cleaning the sacrificial collar without eroding or otherwise damaging the sidewalls. The process comprises an etching stage in which a substrate 20 is placed in the process chamber 25, and the sacrificial collar 100 is maintained around the substrate to add or remove species from a process gas to affect a processing rate of the substrate periphery. The process further comprises a localized cleaning stage in which the substrate 20 is removed, a cleaning gas introduced into the process chamber 25, and a localized cleaning plasma sheath 95 is formed to clean process residues formed on the sacrificial collar 100 substantially without extending the localized cleaning plasma sheath 95 to the sidewalls 30 of the process chamber.

20 Claims, 3 Drawing Sheets

… …

LOCALIZING CLEANING PLASMA FOR SEMICONDUCTOR PROCESSING

BACKGROUND

The present invention relates to a method of processing of a semiconductor substrate and removing process residue deposited on internal surfaces of a process chamber during processing of the substrate.

In integrated circuit fabrication, semiconductor, dielectric, and conductor materials, such as for example, silicon dioxide, silicon nitride, polysilicon, metal silicide, and silicon layers are formed on a substrate and etched to form features such as gates, vias, contact holes, or interconnect lines. The layers are typically deposited by chemical vapor deposition (CVD), physical vapor deposition, or thermal oxidation processes. For example, in a typical CVD process, thin layers of conducting, semiconducting or dielectric material are deposited on a heated substrate by reactant gases, such as $WF_6$, $SiH_4$, $SiH_2Cl_2$, $WSi_2$, or $H_2$. In an etching process, a patterned etch resistant layer of photoresist or a hard mask is formed on the deposited layer by conventional photolithographic methods, and the exposed portions of the deposited layer are etched by energized halogen etchant gases, such as $Cl_2$, HBr, and $BCl_3$. The etchant gas composition also often includes passivating gases, such as $CHF_3$, which are used to generate passivating deposits on sidewalls of etched features to provide a more anisotropic etching process.

One problem in semiconductor fabrication processes is how to clean the process residue, byproducts, and other deposits that are formed on the walls and other component surfaces inside the process chamber during processing of a substrate. In typical CVD processes, the composition of the process residues and deposits depend on the composition of feed gas, and the temperature of the surfaces on which the process residue are formed. In etch processes, the composition of the etch process residue depends upon the composition of vaporized species of etchant process gas, the substrate material being etched, and the mask or resist layers on the substrate. For example, when tungsten silicide, polysilicon, or other silicon-containing layers are etched, silicon-containing gaseous species are vaporized or sputtered from the substrate. Etching of metal layers results in vaporization of metal species. In addition, the resist or mask layer on the substrate is also partially sputtered or vaporized by the etchant gas to form gaseous hydrocarbon or oxygen species. The resultant vaporized and/or gaseous species in the process chamber condense to form polymeric byproducts composed of hydrocarbon species; gaseous elements such as fluorine, chlorine, oxygen, or nitrogen; and elemental silicon or metal species depending on the composition of the layer being etched. These polymeric byproducts form thin layers of etchant process residues that are deposited on the walls and components in the process chamber. The composition of the process residue typically varies considerably across the process chamber surface depending upon the composition of the localized gaseous environment, the location of gas inlet and exhaust ports, and the process chamber geometry. The process residue must be periodically removed to prevent contamination of the substrates being processed in the process chamber and to provide more consistent processing results.

The process residues and deposits are especially a problem in semiconductor fabricating processes in which a sacrificial material is used to change the distribution or concentration gradient of gaseous species around the substrate. A non-uniform or variable concentration of reactive gaseous species around the substrate causes different processing rates across the surface of the substrate. One way of achieving a more uniform distribution of reactive species is to provide a member composed of a sacrificial material having a surface disposed around the substrate that when exposed to an energized process gas or plasma reacts to release or scavenge gaseous species to alter the composition of the process gas at a peripheral edge of the substrate. For example, in a fluorine containing plasma it is known to use a sacrificial collar comprising an oxygen-containing material, such as quartz (a crystalline form of $SiO_2$), to provide oxygen species to the process gas around the peripheral edge of the substrate and thereby create a more uniform distribution of the reactive process gas species across the substrate. As another example, a sacrificial collar composed of silicon can be used to scavenge fluorine from the plasma by reacting with gaseous fluorine species to form $SiF_6$, a volatile compound that is exhausted from the process chamber. However, during the fabrication process, process residues accumulate on the collar forming an impermeable residue layer that blocks or interferes with the exchange of gaseous species between the collar and plasma.

To provide consistent processing from one substrate to another, the reactive surfaces of sacrificial members must be cleaned often to remove the process residue formed on it, thereby allowing it to react with the energized process gas to change the concentration of gaseous species at the substrate edge. One conventional method of removing the process residue is a "wet-cleaning" process in which the process chamber is opened to the atmosphere and an operator scrubs off accumulated process residue with an acid or solvent. To provide consistent process chamber characteristics, after the wet-cleaning process, the process chamber is "seasoned" by pumping down the process chamber for an extended period of time, typically 2 to 3 hours. Thereafter, the process to be performed in the process chamber is performed for 10 to 15 minutes on a series of dummy wafers until the process chamber provides consistent and reproducible results. In the competitive semiconductor industry, the increased cost per substrate that results from the extended process chamber downtime during the wet-cleaning and seasoning process steps, is highly undesirable. Also, the wet-cleaning and seasoning process often provide inconsistent and variable properties. In particular, because the wet-cleaning process is manually performed by an operator, it often varies from one session to another, resulting in variations in process chamber surface properties and low process reproducibility. Thus it is desirable to have a cleaning process that can quickly and reliably remove the process residue formed on the surfaces of the collar.

In one in-situ cleaning method, a cleaning plasma of a reactive cleaning gas, such as an $NF_3$, is formed in the process chamber to clean all the process chamber surfaces including the surfaces of the sacrificial collar. The cleaning process is typically performed after a certain number of substrates are processed in the process chamber to remove all the process residues formed during the processing of the substrates. The cleaning plasma reacts with the process residue to form volatile compounds which are exhausted from the process chamber. However, unlike the wet-clean process in which the operator can selectively clean only the sacrificial collar, the in-situ cleaning plasma cleans all the surfaces in the process chamber. Because of the large area of the exposed surfaces in the process chamber, this cleaning process can take over 15 hours, and the long cleaning time significantly reduces the number of substrates which can be processed in a given time period and increases capitalization costs. In addition, in-situ cleaning plasmas tend to preferentially remove only some of the process residue. In particular, only soft components of the process residue are removed, leaving hard components that later flake-off and contaminate the substrate. It is desirable to have a cleaning process for efficiently removing the process residues deposited on process chamber components.

Another problem with in-situ cleaning processes arises because the cleaning plasma is operated at relatively high power level to achieve an acceptable cleaning rate for cleaning all the process residues in the process chamber. The high power plasma erodes internal process chamber surfaces, such as aluminum surfaces, and damages process chamber components, such as erodible polymer layers, for example, polyimide electrostatic chucks. In addition, the cleaning plasmas often only partially clean the anodized aluminum liners that line the walls of the process chamber that serve as a surface for preferential deposition of process residue. Typically, the process chamber liners are maintained at a low temperature to act as a "sink" for the deposition of volatile process residues. The large amount of process residue that deposits on the liner surfaces is difficult to completely clean off, and partially cleaned residue will flake-off and contaminate the substrate. Moreover, the high power plasma also tends to generate other residue byproducts that cannot be removed except by physically wiping the internal surfaces of the process chamber. For example, $NF_3$ plasma used to clean aluminum process chamber surfaces can form a layer of $Al_xF_y$ compound on the aluminum process chamber surfaces that cannot be easily removed.

Thus it is desirable to have a cleaning plasma that can be used to selectively clean only a portion of the process chamber. To avoid residue flaking, it is also desirable for the cleaning process to remove substantially all the process residues deposited on selected process chamber surfaces without reaching, and incompletely cleaning, other surfaces in the process chamber. There is also a need for a method of removing process residues and deposits without damaging or eroding process chamber components. There is a further need for a method of efficiently removing process residues without forming other unwanted deposits on the process chamber surfaces.

SUMMARY

The present invention provides a method of processing a substrate in a process chamber, and cleaning selected surfaces inside the process chamber, without extending a cleaning plasma to all the surfaces in the process chamber. In a processing stage, the substrate is placed in the process chamber, a surface of sacrificial material is maintained around the substrate, process gas is introduced into the process chamber, and the process gas is energized to process the substrate. The surface of sacrificial material adds or removes species from the process gas to change a processing rate at the substrate periphery. In a subsequent cleaning stage, the substrate is removed, cleaning gas introduced into the process chamber, and a localized cleaning plasma sheath is formed to clean the residues formed on the surface of the sacrificial material. The pressure of cleaning gas in the process chamber is maintained sufficiently high to confine the plasma sheath to the perimeter of the annular surface of surface of the sacrificial material substantially without extending the cleaning plasma to the sidewalls of the process chamber. Preferably, the cleaning gas is maintained at a pressure of from about 200 to about 700 mTorr, and/or a magnetic field is formed in the process chamber that is parallel to the substrate surface and rotates about the substrate to further confine the plasma sheath.

The present invention is particularly useful for etching a substrate in a process chamber having a process chamber liner and a sacrificial collar, and removing process residues from the sacrificial collar without eroding or otherwise damaging the process chamber liner. The substrate is etched in a halogen-containing process gas, such as $CHF_3$, that deposits excessive amounts of polymeric process residues and deposits, particularly at the substrate periphery. The sacrificial collar maintained around the substrate releases 2 to 3 sccm of oxygen to the process gas to reduce the rate of polymeric deposition at the substrate periphery and to provide a more uniform etch rate across the substrate surface. After the substrate is removed, a cleaning gas, such as $NF_3$, $CF_4$, or $SF_6$, is introduced into the process chamber, and a localized cleaning plasma sheath is formed to clean the residues formed on the surface of the sacrificial collar. By maintaining a pressure of from about 200 to about 700 mTorr and/or providing a rotating magnetic field having a field strength of from about 20 to about 500 Gauss, the plasma sheath is confined to a perimeter of the sacrificial collar, without reaching the process chamber liner, thereby preventing partial removal of the process residue layer formed on the process chamber liner.

DRAWINGS

These and other features, aspects, and advantages of the present invention will become better understood with regard to the following description, appended claims, and accompanying drawings which illustrate examples of the invention, where:

Figure 2:
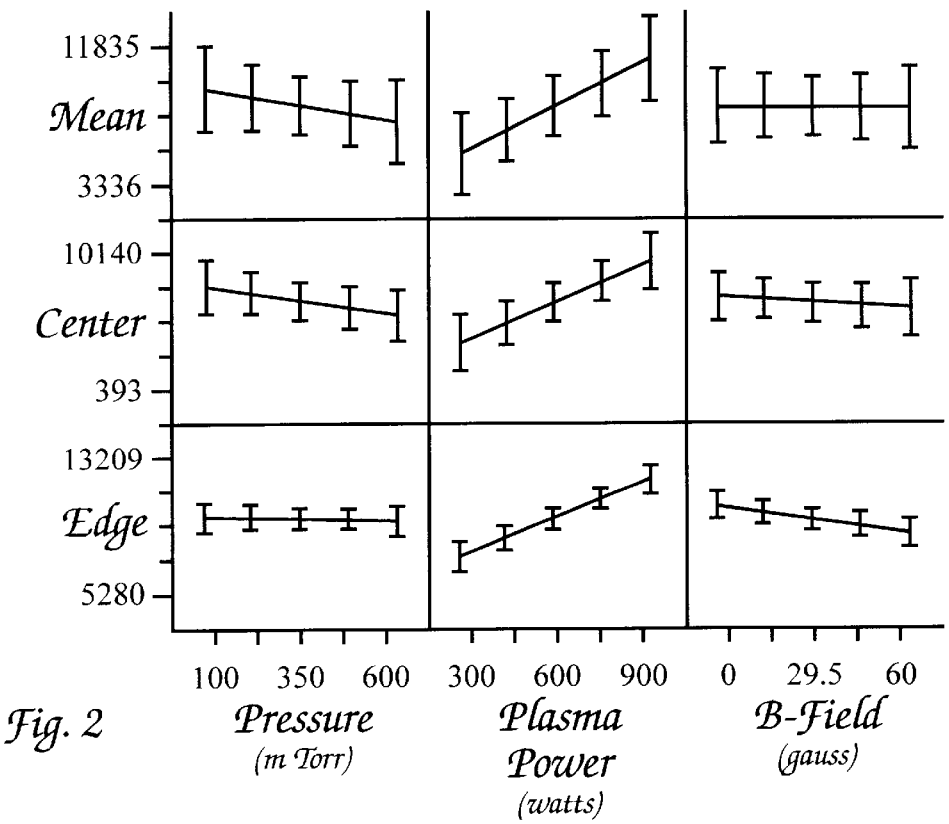
Figure 3A:
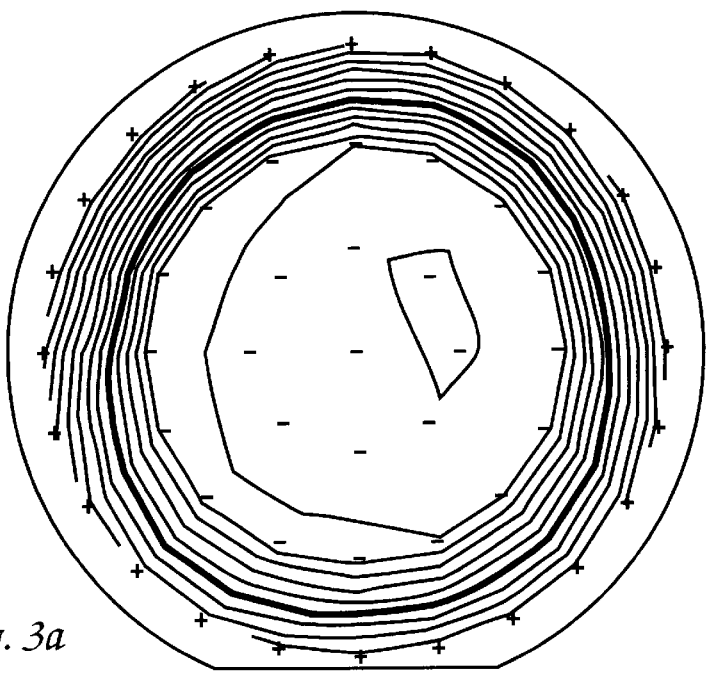
Figure 3C:
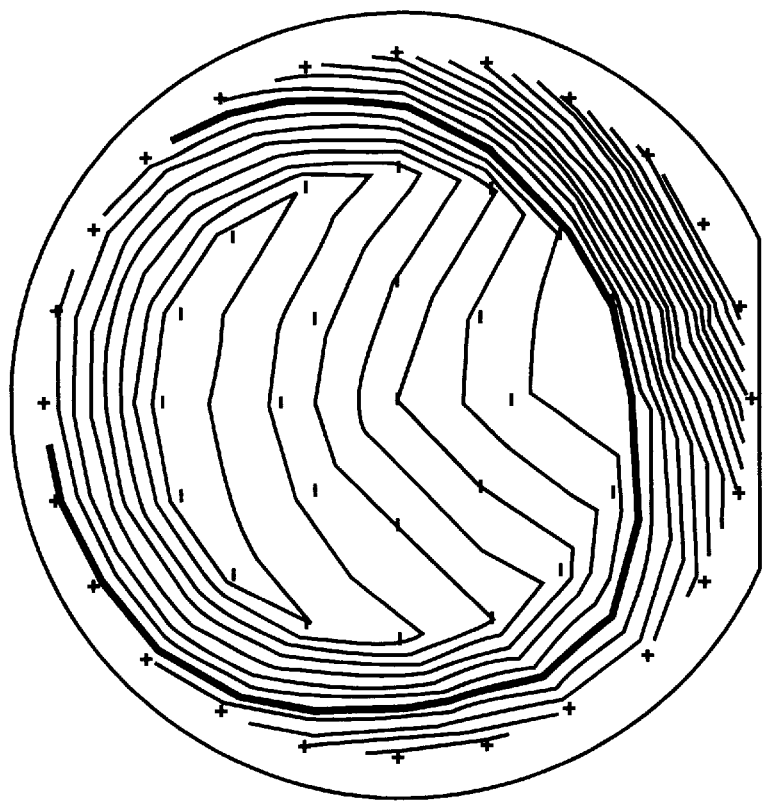
Figure 3B:
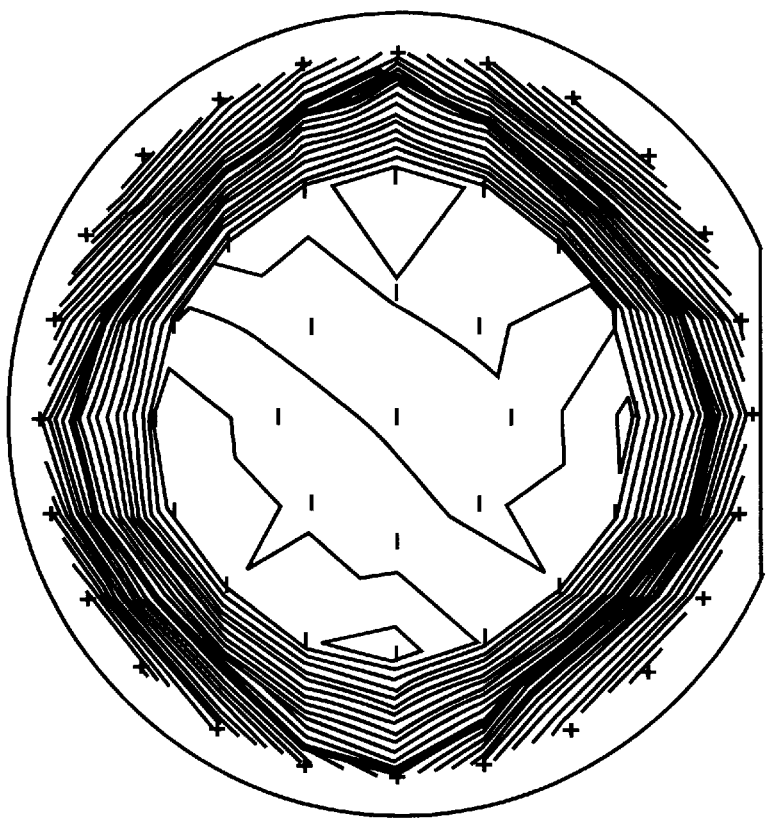

FIG. 2 is a graph showing the average resist etch rate at the edge and center of the substrate, and the mean etch rate across the entire surface of the substrate, as a function of the pressure, power level, and magnetic bias applied to form a localized cleaning plasma sheath; and FIG. 3a to 3c show patterns etched in polymeric resist layers across the surface of selected substrates that correspond to the distribution function, strength, and intensity of the overlying localized cleaning plasma.

DESCRIPTION

Figure 1A:
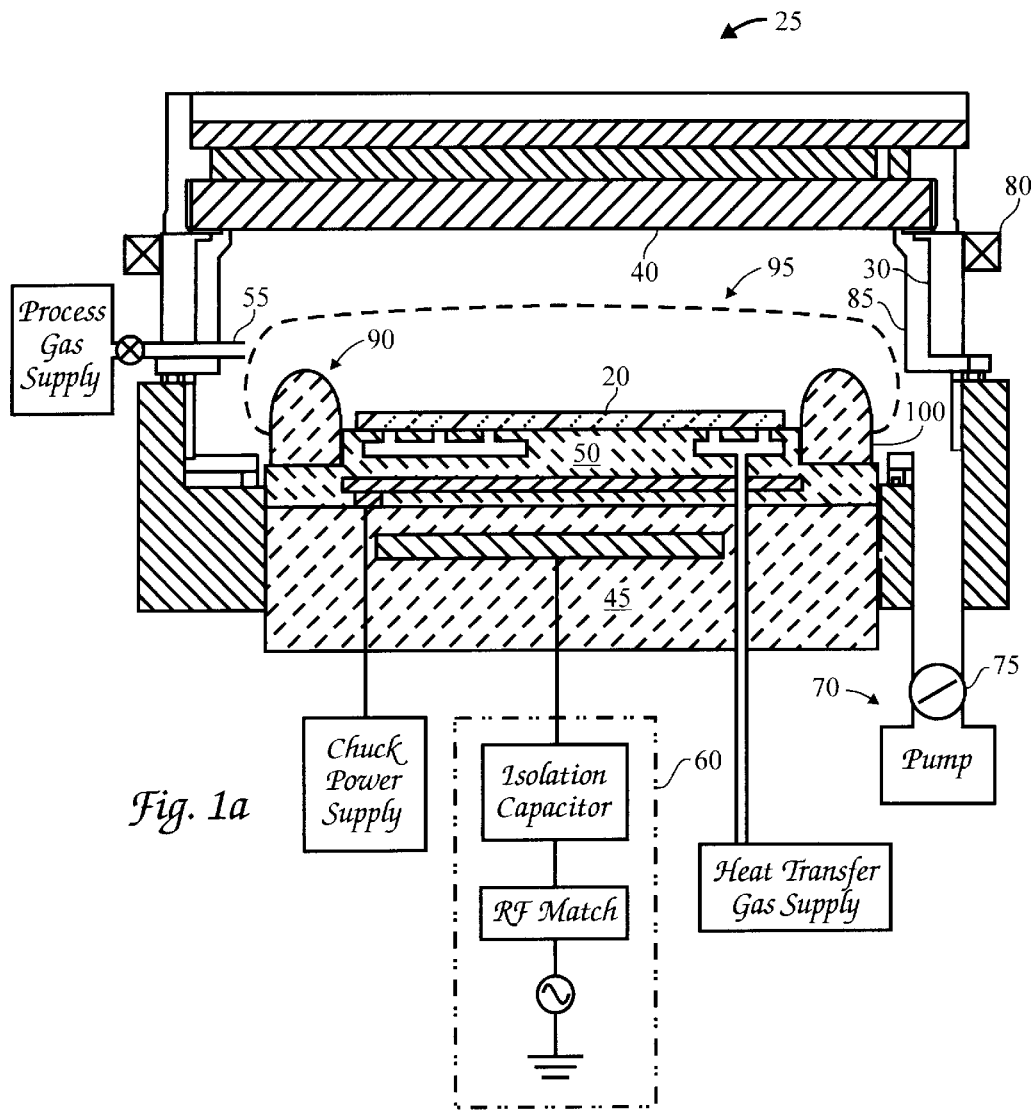
FIG. 1a is a schematic sectional view of a process chamber suitable for performing the process of the present invention.

The present invention provides a method for processing a substrate 20 in a process chamber 25 and selectively cleaning or removing process residues and deposits that are formed on internal surfaces of the process chamber 25 during processing of the substrate 20. The internal process chamber surfaces are selectively cleaned in a step or stage in which process conditions such as process or cleaning gas composition, process chamber pressure, magnetic field strength, and electric field strength are controlled so that only selected internal process chamber surfaces are cleaned, without extending to other surfaces in the process chamber 25. FIG. 1a illustrates an exemplary semiconductor process chamber 25 suitable for performing the process of the present invention. The process chamber 25 shown herein is provided only to illustrate the invention and should not be used to limit the scope of the invention. Generally, the process chamber 25 comprises an enclosure having sidewalls 30, a bottom wall 35, and a ceiling 40 fabricated from a variety of materials including metals, ceramics, and polymers. Typically, the substrate 20 is held on a support 45 for supporting the substrate in the process chamber 25 using an electrostatic chuck 50, which includes heat transfer passages and heat transfer grooves for controlling the temperature of the substrate.

Process gas is introduced into the process chamber 25 through a gas distribution system that comprises a process gas supply and a process gas distributor 55. The process gas introduced into the process chamber 25 is energized to form an energized process gas, or plasma, by a gas energizer 65, or a plasma generator. The plasma generator typically comprises process electrodes defined by the process chamber ceiling 40 and a conductor in below the support 45 that are electrically biased relative to one another by an electrode voltage supply 60 to capacitively couple and energize the plasma. In addition, an inductor coil (not shown) adjacent to the process chamber 25 can be used to generate an inductive field that inductively couples RF power to the process gas to form an energized process gas or a plasma. An exhaust system comprising one or more exhaust pumps 70 and a throttle valve 75 is used to exhaust spent process gas and to control the pressure of the process gas in the process chamber 25.

A magnetic field generator 80, such as a set of permanent magnets or electromagnetic coils, applies a magnetic field to the plasma in the process chamber to increase the density and uniformity of the plasma. Preferably, the magnetic field generator 80 comprises four electromagnet coils radially spaced symmetrically about the substrate 20. A power supply (not shown) powers the electromagnets in quadurature, i.e., by supplying a low frequency sinusoidal current to the four electromagnetic coils, with the sinusoidal current applied to two of the coils being 90° out of phase with current supplied to the other two. The magnetic field generators 80 thereby produce a rotating magnetic field with the axis of the field rotating parallel to the plane of the substrate 20, as described in U.S. Pat. No. 4,842,683, issued Jun. 27, 1989, which is incorporated herein by reference.

Generally, the process of the present invention comprises a processing stage in which the substrate 20 is processed, thereby depositing process residues in the process chamber 25, and one or more cleaning stages, in which the process residue is cleaned or removed from selected surfaces inside the process chamber 25 substantially without opening or exposing the process chamber to atmosphere. In the processing stage, the substrate 20 is placed in the process chamber 25, and a surface of sacrificial material 90 is positioned around the substrate. Process gas is introduced into the process chamber 25 and energized to form plasma or energized gas to process the substrate 20. The surface of the sacrificial material 90 surrounding the substrate 20 adds or removes species from the process gas to change a processing rate at a periphery of the substrate 20. Thereafter, in a cleaning stage, the substrate 20 is removed, and a cleaning gas is introduced into the process chamber 25. A localized cleaning plasma sheath 95 is formed from the cleaning gas by selecting suitable process conditions to remove process residue formed on the surface of the sacrificial material 90, without extending the localized cleaning plasma sheath to the sidewalls 30 of the process chamber 25. This prevents incomplete cleaning or erosion of a process chamber liner 85 that lines the walls of the process chamber 25.

A process according to the present invention will now be described, in the context of the process chamber 25 shown herein, by describing an etching process suitable for etching dielectric layers on a semiconductor substrate 20. Typical dielectric materials comprise silicon dioxide, silicon nitride, PSG (phosphosilicate glass), BPSG (borophosphosilicate glass), or TEOS (tetraethylsilane derived) glass. A patterned mask layer, such as a silicon dioxide or silicon nitride hard mask, is formed on the dielectric layer, and the exposed portions of the dielectric layer between the mask layer are etched using the process of the present invention. The process of the present invention is particularly useful for etching the dielectric layers because the process gas for etching dielectric material often contains a passivating gas from forming sidewall deposits to provide a more anisotropic etch. Typically, the passivating gas also generates excessive amounts of process residues and byproducts, making it necessary to frequently clean the process chamber surfaces. For example, dielectric etching processes often include $CHF_3$ to generate a passivating polymer that deposits on the sidewalls of etched features to provide tapered etching of certain features. This type of etching is desirable for forming features such as tapered vias for multilayer metal containing contact structures used to electrically connect two or more electrically conductive layers separated by an insulating dielectric layer. The tapered vias are shaped like an inverted cone with inwardly sloped sidewalls that form angles of about 70 degrees relative to the surface plane of the substrate 20.

Referring to FIG. 1a, in the etching process a substrate 20 is placed on the electrostatic chuck 50, and a process gas including an etchant gas for etching the substrate is introduced into the process chamber 25 through the gas distributor. Typically, the process gas in the process chamber 25 is maintained at a pressure ranging from about 0.1 to about 200 mTorr. Suitable etchant gases for etching silicon-containing dielectric layers on the substrate 20 comprise halogen-containing gases, for example, HCl, $BCl_3$, HBr, $Br_2$, $Cl_2$, $CCl_4$, $SiCl_4$, $SF_6$, F, $NF_3$, HF, $CF_3$, $CF_4$, $C_2H_4F_6$, $C_2F_6$, $C_3F_8$, $C_4F_8$, $C_2HF_5$, $C_4F_{10}$, $CF_2Cl_2$, $CFCl_3$, $O_2$, $N_2$, He, and mixtures thereof. The process gas composition is selected to provide both a high etch rate and a high etching selectivity ratio. By etching selectivity ratio it is meant the ratio of the rate of etching of the dielectric layer to the rate of etching of the overlying mask layer or underlying layer such as an electrically conductive layer. The process gas further contains a passivating gas. Suitable passivating gases include CO, $CH_3F$, $CHF_3$, $C_2H_2F_2$, $CH_2F_2$ or mixtures thereof. The process gas is energized by the gas energizer 65 to form ions and neutrals that etch the dielectric layer on the substrate 20 to form volatile gaseous species that are exhausted from the process chamber 25.

A preferred gas composition of process gas for etching a dielectric layer comprises $C_4F_8$, CO, $CH_3F$, Ar, and $N_2$. The dielectric layer is etched by the halogen gas $C_4F_8$, which reacts with silicon in the dielectric layer to form volatile compounds of $SiF_6$ that are exhausted from the process chamber 25. The carbon monoxide gas reacts with gaseous fluorine containing species thereby aiding in their removal from the process chamber 25 and enhancing the etch rate of the silicon containing layers. The argon or other inert gas serves as an activator gas that is easily ionized to form ions that collide with the $C_4F_8$ molecules and increase dissociation of the etchant gas. The nitrogen gas serves as a dilutant gas that alters the concentration of the etchant gas and also serves to enhance etch rates by providing more energizing collisions that dissociate gaseous molecules.

As described previously, the $CHF_3$ gas in the process gas serves as a passivating gas that combines with other vaporized gaseous species to form passivating polymers which deposit on sidewalls of the freshly etched features to provide more anisotropic etching. However, the CHF$_3$ gas often generates excessive process residues that are deposited at certain areas on the substrate surface, thereby reducing or stopping the etching in these areas. More particularly, this is often a problem at the periphery of the substrate 20 where the amount of process gas in relation to the available surface area of the substrate 20 provides a higher rate of polymer formation. Thus, the rate of formation of process residue comprising polymeric passivating deposits should be reduced near the substrate periphery to provide more uniform etching rates across the surface of the substrate 20.

To control the rate of formation of the process residue at different areas of the substrate 20, the process chamber 25 also includes a nonvolatile, nongaseous sacrificial material 90 that adds or remove gaseous species from the process gas to affect the processing rate of the substrate. A suitable sacrificial material 90 reacts upon exposure to a process gas or plasma to provide new gaseous species or scavenges gaseous species from the process environment, thereby altering the composition of the process gas at a region of the substrate 20. For example, in an etching process environment having a high passivating polymer content, a sacrificial material 90 comprising an oxygen-containing compound, such as quartz (a crystalline form of SiO$_2$), is used to contribute oxygen species to the process gas to reduce formation/deposition of polymeric process residue at adjacent surface regions of the substrate 20. The oxygen species combines with the polymeric process residue to form gaseous carbon monoxide or carbon dioxide species. As another example, a sacrificial material 90 composed of silicon is used to scavenge fluorine from the fluorine-containing plasma because the silicon is eroded by gaseous fluorine species to form SiF$_6$, a volatile compound that is exhausted from the process chamber 25.

The sacrificial material 90 changes the process gas composition in a predefined region in the process chamber 25, or at a selected portion of the substrate 20, to alter the processing rates at that region and provide a localized control of process gas chemistry. For example, to reduce formation of excessive process residues at the periphery of the substrate 20, an annular surface of sacrificial material 90 is positioned around the periphery of the substrate 20 to alter the composition of the process gas or plasma at the substrate edge. To reduce passivating polymer deposition, the surface area of the sacrificial material 90 exposed to the process gas or plasma is sized sufficiently large to introduce oxygen into the process chamber 25 at a rate equivalent to a flow rate of from about 0.5 to about 20 sccm (more typically about 2 to 3 sccm) for a total process gas flow of from about 150 to about 300 sccm.

Figure 1B:
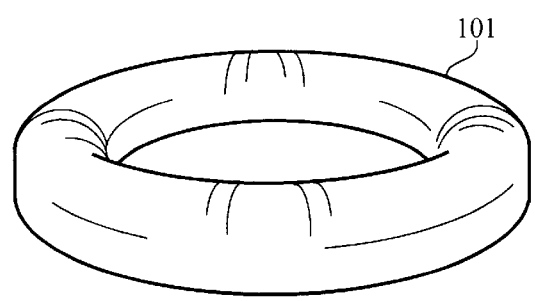
FIG. 1b is a schematic perspective view of a sacrificial collar that can be cleaned by the process of the present invention.

In a preferred configuration, as shown in FIG. 1$b$, the sacrificial material 90 is shaped as a toroid or collar 100 having an inner diameter that is sufficiently large to surround the substrate 20. The sacrificial collar 100 extends from a periphery of the substrate 20 to a periphery of the support 45 and has a raised top surface extending above the surface of the substrate. The toroid collar has a raised hemispherical-shaped surface that curves downward from an apex to a base. The hemispherical surface forms an active reaction surface that provides or scavenges gaseous species and also directs or contains the process gas or plasma on the processing surface of the substrate 20. Preferably, the sacrificial collar 100 has an inner diameter of about 196 mm, a radial thickness of about 36 mm, and an overall height of about 16 mm. More preferably, the base of the sacrificial collar 100 comprises a flat lower surface in close thermal contact with the support 45 to permit the temperature of the sacrificial collar 100 to be controlled by controlling the temperature of the support. The ability to control the temperature of the sacrificial collar 100 is important since the rate at which the material of the sacrificial collar 100 reacts with the energized process gas or plasma to release or scavenge gaseous species depends on its temperature and as well as its surface area.

During the etching process, process residues and deposits comprising polymeric compounds containing halogen, carbon, hydrogen, oxygen, and/or silicon compounds are formed during etching of the substrate 20. The process residues react with and adhere to the surface of the sacrificial collar 100 to form an impermeable layer that is difficult to remove or clean off. The accumulation of process residue on the active reaction surface of the sacrificial collar 100 blocks its function of releasing oxygen-containing species, thereby causing excessive passivating process residue and deposits to form on the periphery of the substrate 20 and resulting in a non-uniform etch across the substrate surface. Thus it is desirable to perform a cleaning process stage between multiple etching cycles to clean the process residue deposits off from the surface of the sacrificial collar 100 to allow the collar to consistently function as intended during processing of all the substrates 20.

The process gas chemistry of the etching process is further defined by a temperature controlled process chamber liner 85 which can be cooled to serve as a "sink" for the preferentially deposition of vaporized process residue species. The chamber liner 85 provides a cleaner etching process by trapping excess residue, or simply serving as a removable residue trap which can be taken out of the process chamber 25 for cleaning to avoid opening the process chamber 25 to clean the residue off the process chamber walls. Preferably, the process chamber liner 85 is an easily removable structure that has a shape conformal to the sidewalls 30 of the process chamber 25. The process chamber liner 85 is temperature controlled by channels (not shown) that circulate heat transfer fluid within the sidewalls 30 of the process chamber 25 to a temperature sufficiently low (or high) to cause process residues to condense and deposit on the liner 85. Preferably, the liner 85 temperature in the etch processes is from about −25° C. to about 60° C., and more preferably from about 5° C. to about 25° C. Typically, the liner 85 is composed of a material that is thermally stable and resistant to erosion by the energized process gas. The liner 85 can be fabricated from, for example, anodized aluminum in a thickness of from about 5 mm to about 12 mm. In addition, it has been found that a liner 85 having a rough inner surface with a Reynolds number of at least about 70 causes the process residue formed on the liner 85 during processing of a substrate 20 to stick to the liner 85 and thereby reduce flaking of the residue and contamination of the substrate.

Generally, it is not desirable to clean the process residue off from the surface of the process chamber liner 85 because the thick deposits of process residues are difficult to remove completely without using a high powered plasma of and a highly aggressive cleaning gas. While a high power plasma will clean the process chamber surfaces, it will also rapidly erode or otherwise damage the surfaces of the liner 85 and of other process chamber 25 components, which is undesirable. Alternatively, a low power or mild cleaning plasma only succeeds in partially cleaning the surfaces of the liner 85, and the remaining process residue deposits flake-off and contaminate the substrate 20. Operating a low power plasma for a sufficiently long time will eventually completely clean the liner 85 without damaging chamber surfaces, but this would take too long of a time to be practical.

In a process according to the present invention, a localized plasma cleaning stage is performed after a suitable number of substrates 20 have been processed to clean-off the process residue formed on the active surface of the sacrificial collar 100, without disturbing the process residue deposited on the process chamber liner 85. Preferably, the cleaning stage is performed after processing or etching of about 1 to about 100 substrates 20, and more preferably, after etching about 5 to about 25 substrates. However, the number of substrates 20 processed before an etching process is performed depends upon the thickness and chemical composition of the process residue or etchant residue deposited on the process chamber surfaces.

In the cleaning stage, the last etched substrate 20 of a batch of substrates is replaced with a bare silicon substrate or dummy wafer to protect the surface of the electrostatic chuck 50. The residual etchant gas in the process chamber 25 is exhausted by fully opening the throttle valve 75 of the exhaust system. Thereafter, a cleaning gas composition is introduced into the process chamber 25. The cleaning gas composition comprises gases that are suitable for reacting with and cleaning the process residues and deposits formed on the sacrificial collar 100. Suitable cleaning gases for cleaning polymeric process residues include an inorganic fluorinated gas selected from the group consisting of $NF_3$, $CF_4$, and $SF_6$. In addition, other gases that react with the etchant process residue, such as oxygen which burns off the polymeric process residues, can be added to the cleaning gas.

A preferred cleaning gas composition for cleaning polymeric process residues off the surfaces of a silicon-containing sacrificial collar 100 consists entirely of $NF_3$. This cleaning gas composition does not leave behind any other residue compositions on the surfaces of the sacrificial collar 100 because the fluorine species in the cleaning gas reacts with silicon-containing sacrificial material 90 to form gaseous $SiF_4$ species. As a result a thin surface layer of the sacrificial material 90 is etched away, thereby removing any process residues that are formed on the sacrificial material 90.

The localized cleaning plasma sheath 95 is formed by energizing the cleaning gas to clean the surfaces of the sacrificial collar 100 substantially without extending the plasma sheath to contact the process chamber liner 85 at the sidewalls 30 of the process chamber 25. The process electrodes are powered to generate the cleaning plasma at a power level that maximizes the rate at which process residue is removed from the sacrificial collar 100. Generally, a higher power level of voltage maintained across the process electrodes will provide more highly dissociated gaseous species that react preferentially with the process residue on the sacrificial collar 100. The plasma power level and the pressure of cleaning gas in the process chamber 25 are controlled to generate a highly aggressive localized cleaning plasma sheath 95 that covers the sacrificial collar 100 without extending all the way to the process chamber liner 85. Suitable plasma power levels of a voltage applied to the gas energizer 65 is from about 100 to about 1100 watts, and more preferably, from about 200 to about 1000 watts. In accordance with the present invention, it has been discovered that maintaining a sufficiently high pressure of cleaning gas in the process chamber 25 during the cleaning process confines the plasma sheath 95 to the perimeter of the sacrificial collar 100 substantially without extending the plasma sheath to the sidewalls 30 of the process chamber 25.

Too low a pressure causes the plasma sheath 95 to spread outwardly and attack the process chamber liners 85 on the sidewalls 30 of the process chamber 25. However, if the pressure is too high, a high power plasma would result in arcing between the process electrode in the support 45 and the process chamber sidewalls 30, which would extinguish the plasma and damage process chamber 25 components. It has been discovered that a preferred pressure of cleaning gas is from about 200 to about 700 mTorr, and most preferably, from 300 to 500 mTorr.

The localized cleaning plasma sheath 95 is further confined to the surface above the sacrificial collar 100 by a magnetic field that is parallel to the surface of the substrate 20 and which rotates about the substrate to confine the plasma sheath to the perimeter of the surface of the sacrificial collar 100. The strong magnetic field is produced by magnetic field generators 80 creates an electromagnetic barrier that confines the dissociated and charged gaseous species in the cleaning plasma to the space extending up to and above the sacrificial collar 100. The rotating magnetic field also maximizes the azimuthal symmetry of the plasma sheath 95 to provide optimal cleaning properties. Preferably, the magnetic field comprises a field strength of from about 20 to about 100 Gauss, more preferably from about 30 to 60 Gauss, and most preferably about 50 Gauss.

In the cleaning stage the sacrificial collar 100 is selectively cleaned by a high-powered localized cleaning plasma sheath 95 that does not extend to other process chamber 25 components, and especially does not contact the process chamber liner 85 on the sidewalls 30 of the process chamber 25. The localized nature of the cleaning stage prevents partial cleaning and resultant flaking of the process residue on the process chamber liner 85 to significantly reduce substrate 20 contamination and improve the yield of integrated circuit chips from the substrate. In addition, the cleaning plasma does not leave behind any other process residues on the collar because the fluorine species in the cleaning gas etches away a thin layer of silicon-containing material from the sacrificial collar 100. The localized cleaning plasma sheath 95 formed by the process of the present invention reduces the down time of the process chamber 25 and increases the process throughput.

The process chamber 25 cleaning stage can further include a process chamber treatment step to recondition or "season" surfaces in the process chamber, including the sacrificial collar 100, after removing off the process residues from the sacrificial collar 100. The seasoning process restores the original chemical reactivity of surface functional groups present on the process chamber surfaces to provide more reproducible processing properties after the cleaning stage has been performed. The surface functional groups present on the process chamber surfaces affects the reactive gaseous chemistry in the process chamber 25, and it is desirable to maintain consistent process chamber surfaces to obtain reproducible substrate 20 processing. In the process chamber treatment step, a dummy silicon substrate is placed in, or left in, the process chamber 25 and a seasoning or treatment gas comprising the major constituent of the processing gas is introduced into the process chamber to season the surfaces of the process chamber. For example, for the etching process described herein, a seasoning gas comprising $CHF_3$ gas is introduced into the process chamber 25 at a flow rate of about 100 sccm at a pressure of about 200 mTorr. The seasoning gas is energized to form a non-localized plasma sheath that extends throughout substantially the entire volume of the process chamber 25 by applying a voltage at a power of about 700 watts to the process electrodes and applying a rotating magnetic field having a field strength of about 30 Gauss. The non-localized plasma sheath is maintained for about 30 seconds to season the process chamber surfaces.

After the process chamber 25 has been operated to process substrates 20 with a RF plasma for a cumulative processing time of about 100 to about 300 hours (typically after successive processing of 1000 to 2000 substrates), and after the cleaning stage has been performed a plurality of times, a "wet-clean" is performed. Preferably, the cleaning stage using a localized cleaning plasma sheath is performed from about 20 to 40 times. In the wet-cleaning process, the process chamber 25 is opened to atmosphere, and scrubbed by an operator using an acid or solvent, such as acetone or aqua regia, to scrub off and dissolve accumulated process residue on the process chamber surfaces. After pumping down the process chamber 25 for an extended period of time, typically 2 to 3 hours, the process chamber is seasoned by a process chamber treatment step as described above until the process chamber 25 provides consistent and reproducible results. In contrast to typical cleaning schedules which require the process chamber to be opened to the environment for cleaning every 70 hours, the processing and cleaning stage method of the present invention allows wet-cleaning after processing of 1000 to 2000 wafers, thereby significantly reducing equipment downtime and increasing substrate 20 throughput.

EXAMPLES

The following examples illustrate use of the present invention for etching substrates 20 and cleaning process residues off the surface of a sacrificial collar 100 that surrounds the periphery of a semiconductor substrate. However, the apparatus and method can be used in other applications as would be apparent to persons skilled in the art, and the scope of the present invention should not be limited to the illustrative examples provided herein.

In these experiments, a silicon wafer having a diameter of 200 mm was coated with polymeric resist in a thickness of 1 to 2 microns. The polymeric resist was used to approximate the composition of process residues comprising polymer passivating deposits which are difficult to deposit to a uniform thickness over a large surface area of substrate 20. A baseline measurement was obtained for the thickness of the resist layer across the surface of the substrate 20 by optical reflectometry methods, using a PROMETRICS reflectometry apparatus.

The coated substrate 20 was placed on the support 45 of an MxP+OXIDE ETCH process chamber. A cleaning gas of $NF_3$ gas was introduced into the process chamber 25 at a flow rate of 100 sccm. A cleaning plasma was generated by biasing the process electrode in the support 45 with respect to the process chamber ceiling 40 with a RF voltage at a relatively high power level. The cleaning plasma was maintained at a pressure to confine the plasma to a localized region above the sacrificial collar 100 at the periphery of the substrate 20. A rotating magnetic field was applied to further confine the cleaning plasma to a localized region above the substrate 20. During the cleaning process, the substrate 20 was cooled to a temperature of 15° C. using a flow of helium on the backside of the substrate 20 maintained at a pressure of about 26 mTorr; and the process chamber wall was heated to a temperature of 15° C.

In Examples 1–9, the set of process conditions for generating localized cleaning plasmas was optimized by a $3^2$ orthogonal matrix factorial design study, shown in Table I.

Table II lists the process conditions of Examples 1–8 of the factorial design study, and Example 10 provides the optimal process conditions that were selected based on the results of the factorial design study and other empirical factors.

TABLE I

| FACTORS | LEVELS | |
|---|---|---|
| | I | II |
| PRESSURE (MTORR) | 100 | 600 |
| RF BIAS POWER LEVEL (WATTS) | 300 | 900 |
| MAGNETIC FIELD (GAUSS) | 0 | 60 |

The localized cleaning plasma was operated in the process chamber 25 for a predefined period of about 120 to 240 seconds so that the localized cleaning plasma etched and removed a concentric pattern of the polymer resist on the substrate 20. Thereafter, mean etch rates at the center and edge of the substrates 20 and average etching rates were measured by conventional methods. The etch rate distribution across the substrate surface was measured using an FT-750 apparatus from KLA-TENCOR, Santa Clara, Calif. The etching rates at the center and edge of the polymer resist layers on the substrates 20 is directly related to the intensity of the overlying plasma sheath 95 and the localized distribution function or concentration of plasma ions over the center and edge of the substrate 20. In addition, the distribution function of the localized plasma sheath 95 is directly related to the shape of the etched resist patterns.

TABLE II

| RUN | PROCESS PRESSURE (mTORR) | MAGNETIC FIELD STRENGTH (GAUSS) | PLASMA GENERATOR POWER (WATTS) |
|---|---|---|---|
| 1 | 350 | 30 | 600 |
| 2 | 100 | 0 | 300 |
| 3 | 600 | 0 | 300 |
| 4 | 100 | 0 | 900 |
| 5 | 100 | 60 | 300 |
| 6 | 600 | 60 | 900 |
| 7 | 100 | 60 | 900 |
| 8 | 100 | 60 | 300 |
| 9 | 100 | 0 | 900 |
| 10 | 100 | 30 | 600 |

The localized cleaning plasma was operated in the process chamber 25 for a predefined period of about 120 to 240 seconds so that the localized cleaning plasma etched and removed a concentric pattern of the polymer resist on the substrate 20. Thereafter, mean etch rates at the center and edge of the substrates 20 and average etching rates were measured by conventional methods. The etch rate distribution across the substrate surface was measured using an FT-750 apparatus from KLA-TENCOR, Santa Clara, Calif. The etching rates at the center and edge of the polymer resist layers on the substrates 20 is directly related to the intensity of the overlying plasma sheath 95 and the localized distribution function or concentration of plasma ions over the center and edge of the substrate 20. In addition, the distribution function of the localized plasma sheath 95 is directly related to the shape of the etched resist patterns.

FIG. 2 shows the average resist etch rate at the edge and center of the substrate 20 and the mean etch rate across the entire surface of the substrate as a function of the pressure, power level, and magnetic bias applied to localize the cleaning plasma. Generally, the intensity of the plasma sheath 95 at the center of the substrate 20 decreased with increasing gas pressure, indicating that a more annular shaped plasma sheath 95 focused over the periphery of the substrate was formed at the higher gas pressures. Increasing the RF bias power level applied to energize the plasma increased the mean etching rate because the higher power plasma etched the polymer resist more aggressively. However, increasing the plasma power level also tends to spread the plasma sheath 95 across a wider area in the process chamber 25 and provide a less focused and more spread out plasma which is not desirable. Increasing the intensity of the magnetic field tended to decrease the etch rates at the periphery of the substrate 20 at a faster rate than a corresponding decrease in etch rate at the center of the substrate.

Selected etched patterns of the polymer resist layers on the substrates 20 of Examples 1–8, are shown in FIGS. 3a to 3c. The shapes of the etched patterns of residual resist across the surface of the substrate directly correspond to the distribution function, strength, and intensity of the overlying localized cleaning plasma sheath 95. A highly etched pattern at the periphery of the substrate 20 (in relation to a less etched pattern at the center of the substrate) demonstrates that the localized cleaning plasma sheath 95 is focused in an annular ring shape above the sacrificial collar 100 and around the periphery of the substrate. The contour line intervals of FIGS. 3a to 3c each represent a change in etch rate of about 50 Å/minute.

FIG. 3a shows the etched pattern of polymer resist layer on a substrate 20 processed according to the process conditions of run no. 4. These process conditions provided a localized plasma sheath 95, but the mean etching or removal rate of the polymer resist layer was relatively low at about 3275 Å/minute. In addition, another problem is that with a low B-field, low pressure and high RF power there is a high risk of arcing in the process chamber. Thus these process conditions were not optimal for forming the localized cleaning plasma.

FIG. 3b shows the etched pattern of polymer resist layer on a substrate 20 processed according to the process conditions of run no. 9, which also provided a relatively low mean resist removal rate of 3278 Å/minute. This is caused by an unstable plasma under these process conditions, which is not desirable. Thus these process conditions were not optimal for forming the localized cleaning plasma.

FIG. 3c shows the etched pattern of polymer resist layer on a substrate 20 processed according to the process conditions of run no. 1, demonstrating a very high polymer etch removal rate having a mean of about 8621 Å/minute. In addition, as apparent from the etch gradient contour lines of FIG. 3c, the etch rate at the periphery of the substrate 20 is much higher than the etch rate at the center of the substrate, and the etch rate rapidly drops at the edge of the substrate as evidenced by the closely spaced contour lines. The correlated localized cleaning plasma sheath 95 is highly focused and has a high concentration of plasma ions in the annular rim shape directly above the sacrificial collar 100 and around the periphery of the substrate 20. The resist removal rates at the periphery of the substrate in excess of 8000 Å/minute was about 2.5 times higher than the resist removal rate of the other substrates 20. These process conditions were optimal for forming the localized cleaning plasma for cleaning the sacrificial collar 100.

The process of the present invention and its localized high power cleaning plasma provides a rapid and efficient method of processing a batch of substrates 20 and of selectively cleaning process chamber components, such as a sacrificial collar 100, without eroding other process components. By focusing the plasma sheath 95 onto the sacrificial collar 100, the localized cleaning process prevents partial cleaning and flaking of the process residue on the liner 85. This significantly reduces substrate 20 contamination from process residue flakes and improves the yield of integrated circuit chips from the substrate. In addition, confining the plasma sheath 95 to a spatial volume directly above the sacrificial collar 100 allows use of a high power plasma of a highly reactive cleaning gas to efficiently clean the sacrificial collar 100 without damaging other process chamber components. In addition, the cleaning plasma cleans polymer etchant residues off from the surface of the silicon-containing sacrificial collar 100 without leaving behind any other residues on the collar because the fluorine species in the cleaning gas etches away a thin layer of silicon-containing sacrificial material 90 to form gaseous $SiF_4$ species, thereby removing any process residues or other byproducts that were formed on the sacrificial collar 100. Thus the process of the present invention reduces the down time of semiconductor process chambers 25, increasing process throughput and yields, and extending process chamber life.

Although the present invention has been described in considerable detail with regard to the preferred versions thereof, other versions are possible. For example, gases that are equivalent in function to $NF_3$, $CF_4$, and $SF_6$ can also be used to form the cleaning gas, and the localized cleaning process can be used to clean other types of process residues from other structures, such as quartz gas distribution plates, focus rings, and ceramic electrostatic chucks 50. Therefore, the appended claims should not be limited to the description of the preferred versions contained herein.

What is claimed is:

1. A method of processing a substrate in a process chamber, the method comprising the steps of:
    (a) in a processing stage, placing the substrate in the process chamber, maintaining a surface of sacrificial material around the substrate, introducing process gas into the process chamber, and energizing the process gas whereby the surface of sacrificial material adds or removes species from the process gas to change a processing rate at the substrate periphery; and
    (b) in a cleaning stage, removing the substrate, introducing a cleaning gas into the process chamber, and forming a localized cleaning plasma sheath from the cleaning gas that is localized to the surface of the sacrificial material to remove process residue formed on the surface of the sacrificial material substantially without extending to and eroding sidewalls of the process chamber.

2. The method of claim 1 wherein the step of forming a localized cleaning plasma sheath comprises maintaining a pressure of cleaning gas in the process chamber that is sufficiently high that the localized cleaning plasma sheath is confined to a perimeter of the surface of the sacrificial material.

3. The method of claim 2 comprising the step of maintaining a pressure of cleaning gas of from about 200 to about 700 mTorr.

4. The method of claim 1 wherein the cleaning stage comprises the step of generating a magnetic field in the process chamber that is substantially parallel to the surface of the substrate and rotates about the substrate.

5. The method of claim 4 wherein the magnetic field comprises a field strength of from about 20 to about 500 Gauss.

6. The method of claim 1 further comprising the step of covering at least a portion of a sidewall of the process chamber with a liner, and setting process conditions of the localized cleaning plasma sheath so that the localized cleaning plasma sheath does not contact and erode the liner.

7. The method of claim 1 wherein the cleaning gas comprises an inorganic fluorinated gas selected from the group consisting of $NF_3$, $CF_4$, and $SF_6$.

8. The method of claim 1 wherein the processing stage comprises an etching stage in which process gas comprising halogen-containing gas is introduced into the process chamber, and energized so that the substrate is etched.

9. The method of claim 8 wherein the surface of sacrificial material adds or removes oxygen species from the process gas.

10. The method of claim 1 wherein the processing stage is repeated at least 5 times before a localized cleaning stage is performed.

11. The method of claim 8 further comprising a wet-cleaning stage comprising the steps of opening the process chamber and scrubbing the surface of the internal surfaces with a cleaning liquid, and wherein the process conditions of the localized cleaning plasma sheath are set such that the cleaning stage is repeated a plurality of times before the wet-cleaning stage is performed.

12. A method of etching a substrate in a process chamber, the method comprising the steps of:
   (a) in an etching stage, placing the substrate in the process chamber, maintaining a silicon-containing sacrificial collar around the substrate, introducing a halogen-containing process gas into the process chamber, and energizing the process gas whereby the sacrificial collar adds or removes species from the process gas to change a processing rate at the substrate periphery; and
   (b) in a cleaning stage, removing the substrate, introducing a cleaning gas into the process chamber, and forming a localized cleaning plasma sheath from the cleaning gas that is localized to the sacrificial collar to remove process residues formed on the sacrificial collar substantially without extending to and eroding sidewalls of the process chamber.

13. The method of claim 12 wherein the step of forming a localized cleaning plasma sheath comprises maintaining a pressure of cleaning gas in the process chamber that is sufficiently high that the localized cleaning plasma sheath is confined to a perimeter of the sacrificial collar.

14. The method of claim 13 comprising the step of maintaining a pressure of cleaning gas of from about 200 to about 700 mTorr.

15. The method of claim 13 wherein the cleaning stage comprises the step of generating a magnetic field in the process chamber that is substantially parallel to a surface of the substrate and rotates about the substrate.

16. The method of claim 15 wherein the magnetic field comprises a field strength of from about 20 to about 100 Gauss.

17. The method of claim 12 further comprising the step of covering at least a portion of a sidewall of the process chamber with a liner, and setting process conditions of the localized cleaning plasma sheath so that the localized cleaning plasma sheath does not contact and erode the liner.

18. The method of claim 12 wherein the cleaning gas comprises an inorganic fluorinated gas selected from the group consisting of $NF_3$, $CF_4$, and $SF_6$.

19. The method of claim 18 wherein the sacrificial collar adds or removes oxygen species from the cleaning gas.

20. The method of claim 18 wherein the sacrificial collar adds or removes fluorine species from the cleaning gas.

* * * * *